(12) United States Patent
Okano et al.

(10) Patent No.: US 8,747,519 B2
(45) Date of Patent: Jun. 10, 2014

(54) METHOD FOR RECOVERING METAL COPPER FROM COATED COPPER WIRES

(71) Applicants: Institute of National Colleges of Technology, JP, Hachioji (JP); Polytech Kagawa Co., Ltd., Marugame (JP)

(72) Inventors: Hiroshi Okano, Takamatsu (JP); Gou Sajiki, Takamatsu (JP); Mitsunori Deguchi, Marugame (JP); Sadao Tanimoto, Marugame (JP)

(73) Assignees: Institute of National Colleges of Technology, Japan, Hachioji-shi (JP); Polytech Kagawa, Co., Ltd., Marugame-shi (JP)

(*) Notice: Subject to any disclaimer, the term of this patent is extended or adjusted under 35 U.S.C. 154(b) by 0 days.

(21) Appl. No.: 13/682,916

(22) Filed: Nov. 21, 2012

(65) Prior Publication Data

US 2013/0081515 A1 Apr. 4, 2013

(30) Foreign Application Priority Data

Sep. 30, 2011 (JP) .................. 2011-215914

(51) Int. Cl.
  *C22B 15/00* (2006.01)
  *C23G 1/00* (2006.01)
  *H01L 21/02* (2006.01)
(52) U.S. Cl.
  CPC .............. *C22B 15/00* (2013.01); *C22B 15/0056* (2013.01); *C23G 1/00* (2013.01); *H01L 21/02079* (2013.01)
  USPC ................. 75/403; 75/638; 75/715; 148/210; 148/223; 134/2

(58) Field of Classification Search
  CPC ...... C22B 15/00; C22B 15/0056; C23G 1/00; H01L 21/02079
  USPC .......... 75/403, 638, 715; 148/223, 210; 134/2
  See application file for complete search history.

(56) References Cited

U.S. PATENT DOCUMENTS 3,225,428 A * 12/1965 Deitz, Jr. ......................... 75/403
4,040,865 A * 8/1977 Eggers et al. ..................... 134/7

FOREIGN PATENT DOCUMENTS

| GB | 1297145 A | * 11/1972 |
| JP | 5-9492 A | 1/1993 |
| JP | 11-188335 A | 7/1999 |
| JP | 2000-86807 A | 3/2000 |
| JP | 2001-72794 A | 3/2001 |
| JP | 2001-170608 A | 6/2001 |
| JP | 2002-53697 A | 2/2002 |

* cited by examiner

*Primary Examiner* — George Wyszomierski
*Assistant Examiner* — Tima M McGurthry Banks
(74) *Attorney, Agent, or Firm* — Westerman, Hattori, Daniels & Adrian, LLP

(57) ABSTRACT

A method selectively recovers a useful substance from waste including a chlorine-containing synthetic resin and metal copper in a mixed state. Metal copper is recovered from coated copper-wire waste. The method includes the steps of heat-treating the waste in form of coated copper wires, each having a coating material made of a chlorine-containing synthetic resin, in oil or under a non-oxygen condition. Here, the coating material is carbonized and a chlorine content of the coating material is reduced. Then the coating material and the copper wire are separated from each other the copper wire is recovered. The chlorine-containing synthetic resin can be treated without generating dioxin.

4 Claims, 4 Drawing Sheets

METHOD FOR RECOVERING METAL COPPER FROM COATED COPPER WIRES

TECHNICAL FIELD

The present invention relates to a method for recovering metal copper from waste including a chlorine-containing synthetic resin and copper, and more specifically to a method for recovering metal copper from coated copper-wire waste (coated wires that are no longer used) by employing oil, e.g., waste oil. The present invention provides a metal-copper recovering technique, which is useful as a method for treating the waste in form of coated copper wires, each including a chlorine-containing resin, e.g., a vinyl chloride resin, that causes problems such as environmental pollution and deterioration of an incinerator when the waste is incinerated, and which enables the metal copper and the resin to be easily separated from each other by heat-treating the waste with waste oil used as a heat medium such that the resin is dechlorinated and carbonized.

BACKGROUND ART

In Japan, various plastics are used in massive amount, and development of the technique for reclaiming the used plastics is an important issue. For reclaiming main types of used plastic products, there are developed a recycling method of utilizing the used plastics as resin materials for the same products again or other plastic products, a method of thermally decomposing the used plastics at high temperature into chemical raw materials, such as synthesis gas and cracked petroleum, a recycling method of chemically decomposing the used plastics and returning them to monomers for conversion into other chemical substances for reuse, and a method of directly utilizing the used plastics as fuel for steam generation, power generation, a cement kiln, etc.

Among various plastics treatment and reclaiming of chlorine-based plastic products, particularly, have become big problems. In Japan, about 1.7 million tons of polyvinyl chloride resin is produced per year. The polyvinyl chloride resin is used in forms integrated with metallic materials in various construction components, coated wires, electric equipment, etc., because of having good characteristics in fire resistance, durability, resistance against oil and chemicals, electrical insulation, strength, flame retardation, weather resistance, coloring flexibility, material cost, bonding, welding, etc. In the 1990s, chlorine-based plastics, including the polyvinyl chloride resin, have been judged as major sources of dioxin and have caused social concerns. At present, dioxin is considered to be generated with imperfect combustion when not only the chlorine-based plastics, but also wastes containing chlorine and aromatic compounds are incinerated. As countermeasures, it is proposed, for example, to reduce a rate of imperfect combustion by improving the performance of an incinerator, to expand the recycling system so as not to incinerate refuses, which contain chlorine, through separation of the refuses, and to cut the amount of chlorine-based plastics used. However, because polyvinyl chloride-based resins are fairly different in chemical properties from general hydrocarbon-based resins, troubles are more apt to occur when polyvinyl chloride is mixed in the waste resin to be recycled.

When organic chlorine-based resins, such as vinyl chloride, are incinerated, hydrogen chloride is generated and it damages an apparatus. In a thermally decomposing apparatus, particularly, hydrogen chloride gas flows into near a condenser along with low-molecular decomposed gas and, therefore, a wide region is damaged by hydrochloric acid. This raises a problem that such a thermally decomposing apparatus cannot be used to thermally decompose the organic chlorine-based resins, including the polyvinyl chloride resin. For that reason, there are proposed several techniques for dichlorinating the polyvinyl chloride resin, and for processing the polyvinyl chloride resin without using any high-temperature process.

For example, a plastic dichlorinating method comprising the steps of melting and kneading waste plastics containing chlorine-based resins, e.g., polyvinyl chloride and polyvinylidene chloride, and exhausting hydrogen chloride, which is generated due to a photolysis action and an pyrolysis action by irradiating the waste plastics in a molten state with an ultraviolet ray from a mercury lamp, is proposed as a method for dichlorinating waste plastics, which can realize dichlorination at comparatively low temperature in a short time, which can selectively decompose couplings between carbons in molecules, thus reducing a concentration of residual chlorine, and which can increase a fuel yield (Patent Document 1).

Furthermore, an apparatus of treating organic chlorine-based resins is proposed (Patent Document 2). For separately recovering hydrochloric acid and oil components from the organic chlorine-based resins, the apparatus separately includes a dichlorinating apparatus for heating the organic chlorine-based resins to 300-350° C. and separating chlorine gas, and a gasification modifying apparatus for heating the residue to 400-450° C. in the presence of a catalyst and decomposing and recovering low-molecular oil components. The chlorine gas separated in the dichlorinating apparatus is cooled and recovered as hydrochloric acid by a hydrochloric-acid recovering apparatus. A part of the oil components is evaporated and resulting combustible gas is burnt in a gas combustion chamber such that combustion exhaust gas is reused as heat sources for various places. The proposed apparatus can realize a simplified and more compact structure, a cost reduction, and energy saving.

Moreover, it is proposed to dichlorinate plastic mixtures by heating them to 200-350° C. in a solvent capable of dissolving or swelling plastics, aliphatic hydrocarbons (heavy oil, light oil, and kerosene oil) or aromatic hydrocarbons (crude naphthalene oil, crude naphtha oil, creosote oil, anthracene oil, and tar) (Patent Document 3). In addition, it is reported, by way of example, that when recycling waste plastics including chlorine-based plastics, such as polyvinyl chloride, triethylene glycol is most effective in a dichlorination process using ethylene glycol, diethylene glycol, triethylene glycol, or propylene glycol as a solvent and KSCN as a nucleophile under the presence of alkali.

When treating products in which the organic chlorine-based resins are mixed or integrated with metallic materials, a more difficult step of separating the resins and the metallic materials from each other is required in addition to the dichlorination.

A technique for treating wastes and products including organic materials, e.g., plastics, and valuable metals, e.g., iron and non-iron metals, in mixed states basically comprises steps of treating the organic materials and recovering the valuable metals. As dry-process techniques having widely been used so far, there are techniques for treating the organic materials, such as a incineration method and a thermal decomposition method, and techniques for recovering the valuable metals, such as a magnetic separation method for recovering iron, an eddy-current separation method for recovering non-iron metals, and an air classification method for separating aluminum and copper. In practice, however, those known methods cannot separate metals and plastics from each other with high efficiency, and cannot selectively recover copper wires from coated copper wires and enameled wires. Although it is conceivable to add a step of air classification, gravity liquid separation, selection using a metal locator, stainless separation using a super-strength magnet, air-table gravity separation, etc., any step has not succeeded in solving the problem of recovering the copper wires. Recently, an amount of useless coated wires has increased year by year. For coated wires having large diameters and exhibiting high recycling efficiency, metals are reused by incinerating them at high temperature or by mechanically removing coatings therefrom. However, thin wires are presently disposed of as industrial wastes because an amount of recoverable metal copper is small and profits are not expectable with the above-mentioned methods.

As wet-process techniques, there are techniques for treating the organic materials, such as a wet oxidation method, a supercritical water-splitting method, and a supercritical hydroxylation method. In treatment of the organic materials, a decomposition process utilizing high-temperature hot water, e.g., supercritical hydroxylation, has a problem in application to the organic chlorine-based resins for the following reason. Because of decomposition in water, it is required to pulverize the organic materials, such as plastics, into particle diameters of about 0.1 mm, to previously separate and remove valuable metals, e.g., non-iron metals and copper wires, having particle diameters of not larger than 5 mm, which are difficult to be separated by ordinary separation equipment, with high efficiency from the viewpoint of preventing accumulation and clogging in a reaction vessel, and to previously remove plastics containing chlorine, such as polyvinyl chloride, with high efficiency. Thus, a practically useful technique capable of separating industrial wastes containing the organic chlorine-based resins and the metallic materials into metals and resins and effectively utilizing them is not yet developed.

Meanwhile, a massive amount of waste oil is generated and techniques for treating and reclaiming the waste oil are important issues in Japan. For example, lubricating oil is widely used in driving equipment, such as internal combustion engines, vehicles, machine tools, and industrial machines. In particular, consumption of engine oil, cylinder oil, hydraulic oil, extreme-pressure lubricating oil, cutting oil, etc. has sharply increased due to widespread use of automobiles caused by recent rapid motorization, mechanization of work to deal with labor shortage, etc. Those various types of lubricants become waste oil at a point in time when their properties have deteriorated after use for a so long time. The waste oil is treated, for example, by removing deteriorated components and mixed ingredients in the deteriorated oil (e.g., cutting oil, gear oil, and quenching oil) and reusing it as a lubricant, by processing the deteriorated oil to be usable as a substitute for heavy oil, by employing the deteriorated oil as supplemental fuel in a kiln, etc., and by incinerating it.

For example, when processing the waste lubricating oil to be usable as fuel, various additives are mixed into the lubricating oil, and heavy metals may be contained therein. If the waste lubricating oil containing the heavy metals is reused as boiler fuel, etc., the heavy metals are mixed into ash, thus causing environmental pollution. A technique for removing the heavy metals from the waste lubricating oil is proposed to cope with the above-mentioned problem (see, e.g., Patent Document 4).

PRIOR ART LIST

Patent Documents

[Patent Document 1] Japanese Patent Laid-Open Publication No. 2002-53697

[Patent Document 2] Japanese Patent Laid-Open Publication No. 2001-170608

[Patent Document 3] Japanese Patent Laid-Open Publication No. 2001-72794

[Patent Document 4] Japanese Patent Laid-Open Publication No. H5-9492

DISCLOSURE OF THE INVENTION

Problems to be Solved by the Invention

Before dioxin has become the problem, a technique of burning and removing polyvinyl chloride of coatings by ordinary incineration and taking out remained metal copper was practiced in general. After toxicity of dioxin has started to be reported, metal copper is taken out by incinerating the coated copper wires at temperature higher than 900° C. at which dioxin is not generated. However, such a method is disadvantageous in that an incinerator is expensive, durability of inner materials of the incinerator is insufficient, and a fuel cost is increased. Furthermore, if the operation of the incinerator is stopped midway, dioxin is generated at a point in time when the temperature in the incinerator lowers to 900° C. or below. Therefore, the incinerator has to be operated at all times. While an apparatus for mechanically stripping off coatings of coated copper wires having large diameters has been employed recently, such an apparatus cannot practically be applied to thin wires due to poor efficiency. Regarding low-temperature incineration, there are reported a technique for optimizing the atmosphere and the pressure in the incinerator, and a technique for reducing generation of dioxin by employing a catalyst. However, those techniques are disadvantageous in that a large-scaled vacuum system is needed and the size of the incinerator itself is increased, and that the catalyst is expensive and the cost is increased. Another problem is a difficulty in separating the metal copper and modified materials of the coatings after the treatment.

An object of the present invention is to develop and provide novel means capable of recovering metal copper from coated copper-wire waste in which organic materials, e.g., plastics containing chlorine, the metal copper, etc. are present in a mixed state.

Means for Solving the Problems

For solving the problems described above, the present invention provides the following means:

(1) A method for recovering metal copper from coated copper-wire waste, the method comprising the steps of heat-treating the waste in form of coated copper wires, each having a coating material made of a chlorine-containing synthetic resin, at 130-300° C. in oil and/or in a nitrogen atmosphere or under reduced pressure of not higher than 0.3 atmosphere without using oil, thereby carbonizing the coating material and reducing a chlorine content of the coating material, and separating the coating material and the copper wire from each other, thereby recovering the copper wire.

(2) The method for recovering the metal copper from the coated copper-wire waste according to above (1), wherein the method comprises the steps of heat-treating the waste at 130-300° C. in the oil, and then heat-treating the waste at 130-300° C. in the nitrogen atmosphere or under the reduced pressure of not higher than 0.3 atmosphere without using oil.

(3) The method for recovering the metal copper from the coated copper-wire waste according to above (1), wherein, in the step of performing the heat treatment in the oil at 130-300° C., the heat treatment in the oil is performed in coexistence of an alkaline substance.

(4) The method for recovering the metal copper from the coated copper-wire waste according to above (1), wherein the method further comprises the steps of, after recovering the copper wire, further heat-treating the coating material in oil to further reduce the chlorine content of the coating material, and recovering the heat-treated coating material as carbon-based fuel.

(5) The method for recovering the metal copper from coated copper-wire waste according to above (1), wherein the chlorine-containing synthetic resin is polyvinyl chloride, polyvinylidene chloride, a vinyl chloride copolymer, a chlorinated resin, or a mixture of the chlorine-containing synthetic resin and another resin.

Advantageous Effect of the Invention

According to the present invention, it is possible to recover, from the waste including a chlorine-containing resin and metal copper, the chlorine-containing synthetic resin having been dichlorinated and the metal copper. In particular, the present invention is adapted to recover metal copper from the coated copper-wire waste using waste oil or under reduced oxygen pressure, the waste including the chlorine-containing synthetic resin, which causes the problems, such as environmental pollution and deterioration of the incinerator, when incinerated. Stated another way, the present invention can carbonize and embrittle the coating resin by the heat treatment such that the metal copper can easily be recovered from the coated copper wires after the carbonization.

Furthermore, by treating two types of industrial wastes, i.e., the coated copper-wire waste and the waste oil, in combination, the metal copper can be recovered without generating toxic substances, such as dioxin. For example, a dioxin concentration in the waste after the heat treatment under the reduced pressure of 0.1 atmosphere according to the present invention can be reduced to be not larger than 1/100 of a value at which industrial waste disposal is allowed. The boiling process carried out in the oil not only suppresses generation of dioxin, but also facilitates separation of the coated resin and the metal copper. The produced carbon or carbonaceous material (hereinafter refer to carbon) can be used as solid fuel by shaping the carbon under pressure. In addition, the oil, e.g., the waste oil, having been used in the present invention can be reused as fuel, etc.

BRIEF DESCRIPTION OF THE DRAWINGS

In FIG. 2, "Measurement A" represents heat treatment in turbine oil at 230° C., "Measurement B" represents heat treatment in turbine oil at 230° C., to which lime is added, and "Degreasing" represents the case including treatment to remove an oil component, which has been attached in primary treatment using oil, through cleaning with a surfactant (detergent). "Prediction (natural logarithm)" represents a predicted value based on natural logarithm.

MODE FOR CARRYING OUT THE INVENTION

The present invention is a method for recovering metal copper from waste including a chlorine-containing synthetic resin and the metal copper through the steps of heat-treating the waste including the chlorine-containing synthetic resin and the metal copper in oil and/or under a non-oxygen condition, thereby dechlorinating and carbonizing the chlorine-containing synthetic resin, and then separating the metal copper and the carbonated chlorine-containing synthetic resin. Thus, the present invention provides a novel waste treating technique that is economical and safe, and that can recover the metal copper from the waste including the chlorine-containing synthetic resin and the metal copper, i.e., the waste for which it has been difficult to develop an appropriate treating method.

Practical application of the present invention is advantageous in that metal copper as useful resources can be recovered through the treatment of the waste including the chlorine-containing synthetic resin and the metal copper, and that when waste oil is used as the treating oil, the waste oil is effectively reused. Various types of mineral oil, plant oil, and animal oil may optionally be used as the waste oil. Quality of the waste oil is not particularly limited, and even waste oil having such a contamination level or a deterioration level as just allowing direct use as fuel is also usable. Thus, according to one aspect, the present invention is advantageous in effectively utilizing the waste oil. The waste oil used in the steps of the present invention is further reused as fuel, etc. Another advantage is that the copper recovered by the present invention can easily be reused because of having high purity. Moreover, by further heat-treating coating materials of copper wires in oil after recovering the copper wires to further reduce the chlorine content thereof, the coating materials can be utilized as regenerated fuel, i.e., carbon fuel containing a minute amount of chlorine with the chlorine content of not larger than 1% and preferably not larger than 0.3%, or utilized in form mixed into another fuel.

The waste including the chlorine-containing synthetic resin and the metal copper, used in the present invention, may be in any form insofar as the waste includes both of them. Examples of that waste are waste in which the chlorine-containing synthetic resin and the metal copper are integrated or joined with each other, typically an electric wire, waste in which the chlorine-containing synthetic resin and metals are mixed, typically waste in which the chlorine-containing synthetic resin and the waste metal copper having been generated in different places are mixed together in a state difficult to separate them, and waste additionally including synthetic resins other than the chlorine-containing synthetic resin.

Figure 1:
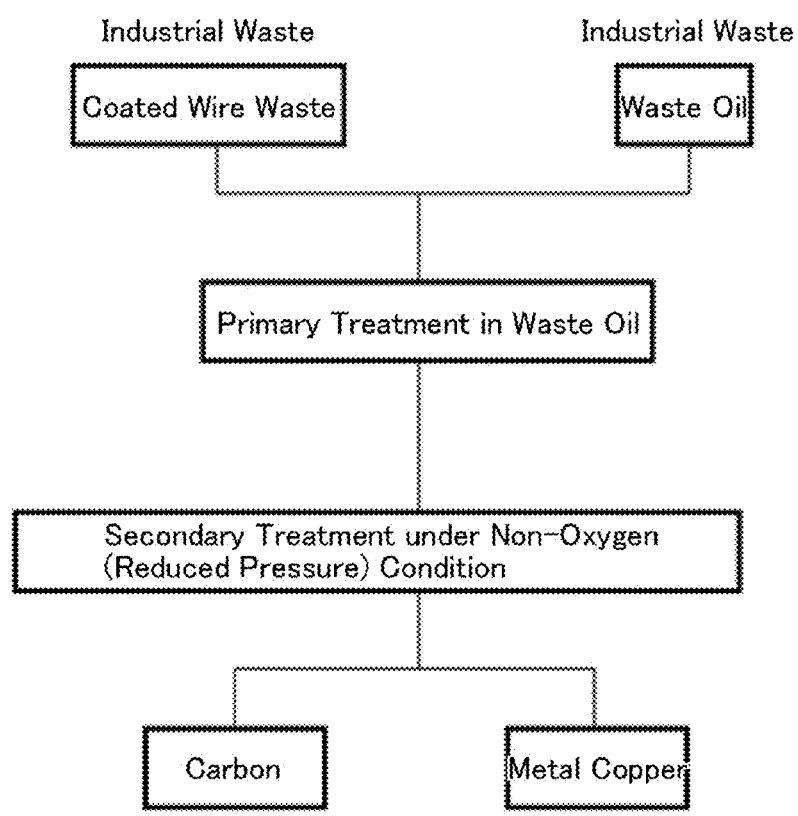
FIG. 1 is a flowchart illustrating an overall outline of the present invention.

FIG. 1 is a flowchart illustrating an exemplary outline of the present invention for recovering the metal copper from coated-wire waste. The illustrated example includes the steps of separately recovering the metal copper from the coated-wire waste, i.e., primary treatment for heat-treating the coated-wire waste, as industrial waste, in the waste oil, to thereby heat-treat the chlorine-containing synthetic resin in a coating material of each coated wire, and secondary treatment for heat-treating the waste under a non-oxygen condition. Those heat treatments can achieve the intended object of the present invention even when one of the heat treatments is performed solely.

[Chlorine-Containing Synthetic Resin]

Practical examples of the chlorine-containing synthetic resin capable being treated according to the present invention include copolymer resins of vinyl chloride and vinylidene chloride, such as a polyvinyl chloride resin, a polyvinylidene chloride resin, a vinyl chloride-ethylene copolymer, and a vinyl chloride-vinyl acetate copolymer, chlorinated resins, such as chlorinated polyethylene, chlorinated rubber, and chlorinated polyether, and blends of the chlorine-containing synthetic resin and other resins. However, the chlorine-containing synthetic resin is not limited to the above-mentioned examples, and it involves all types of resins containing chlorine.

[Oil]

The method of the present invention is carried out through the primary treatment in oil and/or the secondary treatment under the non-oxygen condition, e.g., under reduced pressure. The oil functions not only as a heat medium for heating the chlorine-containing synthetic resin, but also as a receptor for a chlorine substance that is produced from dechlorination of the chlorine-containing synthetic resin, thus the oil contributes to dechlorination and carbonation of the coating material. The waste oil or unused oil can be employed.

In general, regarding utilization of the waste oil, studies have rigorously been conducted on directly recycling the waste oil as energy resources. Particularly, for stable waste oil having a high boiling point, e.g., waste turbine oil, the solvent function of such oil has not been utilized so far. The waste oil is not limited to the particular type of oil on condition that it is able to function as a heat medium for the chlorine-containing synthetic resin and to promote the dechlorination. When oils containing heavy metals, etc. dissolved therein are used, those heavy metals, etc., are preferably removed in advance.

The oil is selected from among mineral oil, plant oil and fat, and animal oil and fat. Examples of the mineral oil include not only lubricating oils, such as turbine oil, machine oil, spindle oil, gasoline engine lubricating oil, diesel engine lubricating oil, but also insulating oil, cutting oil, hydraulic operating oil, compressor oil, and fuel oil.

Examples of the plant oil and fat include waste oils resulting from soybean oil, cotton seed oil, palm oil, safflower oil, olive oil, coconut oil, sesame oil, rape seed oil, sunflower oil, rice bran oil, tung oil, camellia oil, castor oil, linseed oil, groundnut oil, cacao oil, corn oil, and kapok oil. Examples of the animal oil and fat include beef tallow, pig tallow, horse tallow, sheep tallow, milk fat, fish oils, and whale oil, the fish oils including herring oil, sardine oil, and squid oil.

[Heat Treatment of Chlorine-Containing Synthetic Resin]

The heat treatment in the waste oil serves as treatment for dechlorination and carbonation, and further as treatment for embrittling the coating resin. The treatment of the chlorine-containing synthetic resin is performed by boiling the waste (e.g., coated copper wires) including the chlorine-containing synthetic resin and metals in the waste oil (e.g., turbine oil) at 130° C.-300° C., preferably 140-250° C., for 0.1-10 hours, preferably 0.1-2 hours. The heat treatment is usually carried out under ordinary pressure or reduced pressure. The heat treatment step proceeds, for example, in such a state that the coated copper wires each including the coating material made of the chlorine-containing synthetic resin is boiled in the waste oil, or that the coated copper wires are fried in the waste oil. Accordingly, the coating resin is carbonized and dechlorinated by heat, and bubbles enter a gap between the coating resin and the metal copper, thus causing them to be easily separated from each other.

In a process of the heat treatment, the chlorine-containing synthetic resin is treated, for example, as follows. The chlorine-containing synthetic resin is first softened and, with further heating, dechlorination thereof is started. Chlorine is volatized and can be recovered as hydrogen chloride. The dechlorinated resin residue is carbonized and is finally reusable as fuel. Thus, by heating the chlorine-containing synthetic resin along with the waste oil at preferably 140-250° C., chlorine contained in the chlorine-containing synthetic resin is changed to hydrogen chloride while the dechlorinated resin is obtained as a residue. As a result of analyzing the coating material after being boiled together with, e.g., turbine oil by employing a fluorescence X-ray apparatus, it is confirmed that chlorine in vinyl chloride can be decomposed and removed at a rate of not smaller than 90% through boiling in the waste oil. One part of the decomposed chlorine is extracted into the waste oil, and the other part is released to the outside of a reaction system. However, because the heat treatment is performed at temperature of not higher than 300° C., the chlorine is hardly changed to dioxin. The chlorine dissolved in the waste oil can easily be released from the waste oil by carrying out the dechlorination step under ventilation of inert gas. The chlorine discharged during the process of the heat treatment can be recovered by a known apparatus, such as a scrubber, which is used in a semiconductor process (specifically, in a metal-film etching step: RIE step).

Furthermore, the heat treatment is performed under a non-oxygen condition, e.g., in an inert gas atmosphere or under a reduced pressure condition, without using oil. In that case, the heat treatment is preferably performed at temperature of 140-180° C. under reduced pressure of not higher than 0.3 atmosphere.

In more detail, the heat treatment includes the primary treatment and the secondary treatment, and it is preferably performed by continuously carrying out both the treatments. However, the intended object of the present invention can also be achieved even by performing one of the primary treatment and the secondary treatment solely.

[Primary Heat Treatment]

The type of oil used to heat-treat the coated copper wires, each having the coating material made of the chlorine-containing synthetic resin, can optionally be selected insofar as the oil is able to effectuate the heat treatment of the coated copper wire. Preferably, heat of the oil is transferred to the coating material with high efficiency, and the coated copper wire is held, for example, in a state completely immersed in the oil. The temperature of the heat treatment is preferably not lower than 130° C., more specifically in a range of 190-300° C. between the decomposition temperature of the vinyl chloride resin and the temperature at which dioxin is synthesized. Because dioxin is most generated in a temperature range of 300° C.-325° C., the heating temperature has to be avoided from exceeding 300° C. An appropriate heating time is about 0.5-10 hours. The heating time longer than such a range is not preferable from the economical point of view. Conversely, if the heating time is too short, the intended object of the present invention cannot be achieved. The primary heat treatment is preferably performed under stirring.

The treatment time can be cut to about 10 minutes by adding 15-18 parts by weight of an alkaline substance (e.g., lime) to 100 parts by weight of the chlorine-containing synthetic resin so as to coexist during the heat treatment.

[Secondary Heat Treatment]

The secondary treatment is performed under a non-oxygen condition, e.g., in an inert gas atmosphere or under a reduced pressure condition, without using oil. Preferably, the heat treatment is performed under reduced pressure of not higher than 0.3 atmosphere at temperature of 130-300° C. and more preferably at temperature of 140-180° C. The heating time is 0.5-6 hours, preferably 1-6 hours. The heat treatment is performed under the non-oxygen condition at 150° C. for 1 hour, for example, as most practical conditions. While the non-oxygen condition can be realized by reducing pressure with a vacuum pump, a similar effect can also be obtained with the heat treatment in inert gas (e.g., in a nitrogen atmosphere). Which one is to be employed is determined as appropriate in consideration of the cost. When the heat treatment is performed under the reduced pressure, bubbles are apt to enter a gap between the coating resin and the metal copper, thus causing them to be more easily separated from each other.

The pressure condition in the secondary treatment is just required to be not higher than 0.3 atmosphere, and the object of the present invention can sufficiently be achieved even at a lower pressure value. However, if the treatment temperature is higher than 300° C., chlorine having not been removed in the dechlorination process causes generation of dioxin. If the treatment temperature is too low, the carbonation reaction does not proceed satisfactorily. After the end of the secondary treatment, the chlorine content of the coating resin is about 10% by weight.

Taking account the fuel cost in the secondary treatment, the temperature is optimally set to about 150° C. As one example, by performing the secondary heat treatment through the steps of putting a sample, which has been subjected to the primary treatment (performed in the waste oil at 230° C. for 2 hours), in a metal-made vessel, reducing pressure to about 0.1 atmosphere by a vacuum pump, and heat-treating the sample at 150° C. for 1 hour, a more satisfactory result is obtained than that obtained with either one of the primary treatment and the secondary treatment. It is further confirmed that dioxins are not contained in the sample after both the heat treatments.

[Alkaline Substance]

By adding the alkaline substance so as to coexist in the process of dechlorinating the chlorine-containing synthetic resin, an acidic chloride, e.g., hydrogen chloride, which is produced by the dechlorination process, can be removed with high efficiency. For example, when the alkaline substance is dispersed into the waste oil and is stirred by blowing air, reaction of the alkaline substance with the generated hydrogen chloride can be promoted. With the presence of the alkaline substance, a superior effect can be obtained in points of cutting the heating time and reducing the residual chlorine concentration. The alkaline substance is used preferably in 15-80 parts by weight and more preferably in 30-70 parts by weight with respect to 100 parts by weight of the chlorine-containing synthetic resin. The alkaline substance may be any compound insofar as it is able to react with an acidic compound that is generated in the dechlorination process. Preferable examples of the alkaline substance include hydroxides of alkali metals, carbonates of alkali metals, hydroxides of alkaline earth metals, and carbonates of alkaline earth metals. In practice, sodium carbonate, calcium oxide, calcium hydroxide, calcium carbonate, magnesium hydroxide, etc. are preferably used.

[Selective Recovery of Metal Copper and Solid Fuel from Carbonized Coated Copper Wire]

Because a bonding force is weakened at the interface between the carbonized resin and the metal copper of the coated electric wire after being subjected to the heat treatment, the coated electric wire can easily be separated into the metal copper and the carbonized resin by applying, e.g., mechanical vibration thereto. The metal copper and the carbonized resin can be readily and high-efficiently separated into the metal copper and the by pulverizing and sieving them without using a special selection means. The separation of the metal copper and the carbonized resin can be sufficiently performed, for example, just by loading the heat-treated materials into a drum having holes and by rotating the drum for several minutes while vibrating it. The metal remains in the drum, and the carbon drops downwards. By recovering and pressing the dropped carbon, the carbon can be recycled as heat sources in the steps of the primary treatment and the secondary treatment. Furthermore, the separated carbon can be used as solid fuel, i.e., a solid heat medium, in other steps. For example, the recovered carbon is usable as fuel to be burnt in any of steps for handling coke, coal, iron ores, sintered ores, granular iron, and iron scraps, or it can be loaded into a furnace in a state mixed with them. Moreover, the produced solid fuel can be cyclically used as fuel for heating the waste oil or for the incinerator. Thus, the present invention can provide a fuel-free and low-cost process.

By heat-treating the recovered carbon in the waste oil again in a temperature range of 190-300° C., preferably after pulverizing the carbon into size of not larger than 2 mm, the chlorine concentration in the carbon is reduced to about 4% by weight, preferably not larger than 1% by weight, and most preferably not larger than 0.3% by weight with the treatment at 230° C. for 10 minutes to 1 hour, for example, regardless of whether 60% by weight of the alkaline substance (e.g., lime) is added or not. The thus-obtained carbon can be utilized as fuel directly or by mixing about 10% by weight of the carbon into another fuel (see FIGS. 3 and 4).

EXAMPLE 1

A copper wire (3 mmφ) coated with the vinyl chloride resin in the composition shown in Table 1 was treated as follows.

TABLE 1

| Type of coated wire | Coating material (wt %) | Wire material (wt %) |
|---|---|---|
| Lead wire coated with vinyl chloride resin | vinyl chloride resin 50 | copper 50 |

20 L of turbine oil to be discarded and coated-wire waste (about 5 kg of copper wires molded with polyvinyl chloride) having the same volume and cut into a length of 50 cm were put into a metal-made vessel filled with waste oil (mineral oil) and were subjected to the primary treatment at 230° C. for 2 hours. Assuming that molded polyvinyl chloride is a pure polyvinyl chloride, coatings of the wires contain about 56% by weight of chlorine.

The chlorine content of the coatings after the end of the primary heat treatment was reduced to 12% by weight. Then, the treated coated-wire waste was further subjected to the secondary treatment at 150° C. for 1 hour under the non-oxygen condition. The non-oxygen condition was set to pressure of 0.1 atmosphere by employing a vacuum pump. More specifically, about 4 kg of the sample after the end of the above-mentioned primary treatment (in oil at 230° C. for 2 hours) was loaded into an iron-made vessel having a volume of about 20 L, and was heat-treated at 150° C. for 1 hour after reducing the pressure in the vessel to about 0.1 atmosphere by employing a vacuum pump. It was confirmed that dioxins were not contained in the sample after the secondary treatment.

By putting the produced carbon in a drum having holes and vibrating the drum for 5 minutes, metal copper remained in the drum, and the carbon dropped through the holes of the drum. Thus, the metal copper and the carbon could simply be separated from each other. Such a result was attributable to the fact that the copper and the carbon were brought into an easily separable state by the secondary treatment. An amount of the recovered metal copper was about 2.5 kg. With the heat treatment, the coated-wire waste was held in a state fried in the waste oil, and bubbles were generated between the electric wire and the coating material, thus making them easily separable. Additionally, a similar test was conducted using unused plant oil (frying oil). When the test was conducted at temperature of 130-300° C. and the same result as that in the case using the waste oil (mineral oil) was obtained.

EXAMPLE 2

Figure 2:
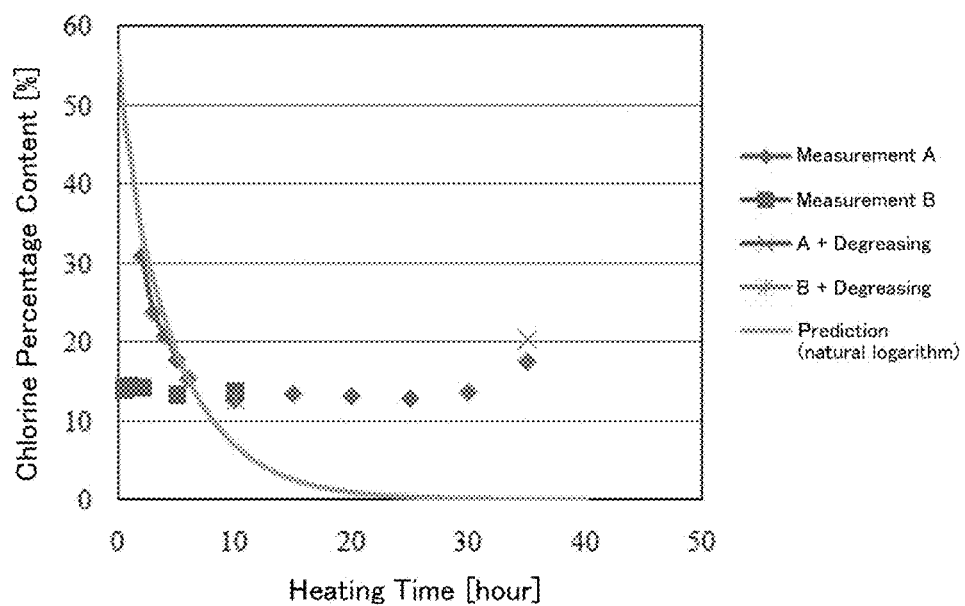
FIG. 2 is a graph plotting the relationship between a chlorine content in a vinyl chloride resin and a heat-treating time when calcium hydroxide coexists in heat treatment and when it does not coexist.

10 L of turbine oil to be discarded and about 1-kg of coated-wire waste (copper wires molded with polyvinyl chloride) were put into a metal-made vessel with the coated-wire waste being fully immersed in the oil, and were heated to 230° C. The heating was continued for a time from 1 hour to 30 hours, and a chlorine concentration in the coated-wire waste heated in the waste oil was measured at intervals of a predetermined time with fluorescence X-ray analysis. As a result, it was found that the residual chlorine was reduced to about 12% through the heating of not shorter than 10 hours. Chlorine in the coated-wire waste was dissolved in the waste oil or released to the atmosphere as hydrogen chloride. Since the heating temperature was held to be not higher than 300° C., dioxin was not generated. Measurement results of dioxin were 0.14 mg/g in terms of a measured concentration value of TOTAL dioxins (PCDDs+PCDFs+coplanar PCBs) and 0.045 ng-TEQ/g in terms of a measured amount (toxicity equivalent). FIG. 2 plots the measured values representing the relationship between the chlorine concentration in the coating resin and the heating time. The measurement results in Example 2 are denoted by "Measurement A" in FIG. 2.

EXAMPLE 3

When carrying out the heat treatment in Example 2, lime ($Ca(OH)_2$) was added in amount corresponding to about 50 parts by mass into the waste oil (turbine oil) with respect to 100 parts by weight of the polyvinyl chloride in the heating step. The lime neutralized the hydrogen chloride generated from the polyvinyl chloride during the heat treatment and prevented the hydrogen chloride from being vaporized into the atmosphere and from being dissolved in the waste oil. With the addition of the lime, the residual chloride was abruptly reduced to about 12% (see "Measurement B" in FIG. 2) in the heating time of not longer than 1 hour, particularly about 10 minutes. The chlorine was accumulated as calcium chloride on the bottom of the vessel, and it could be recovered as solid calcium chloride. Thus, it was found that the dechlorination effect was increased by adding the alkaline substance.

EXAMPLE 4

About 1 kg of coated-wire waste (copper wires molded with polyvinyl chloride) was put into a metal-made vessel and was held at 150° C. for 1 hour in a state under reduced pressure at 0.1 atmosphere. Chlorine in the coated-wire waste was released as hydrogen chloride into the vessel. Because of the treatment under the reduced pressure, the hydrogen chloride was generated in a larger amount. The heat treatment under the reduced pressure enabled the copper wires and their coating to be separated more easily.

EXAMPLE 5

Figure 3:
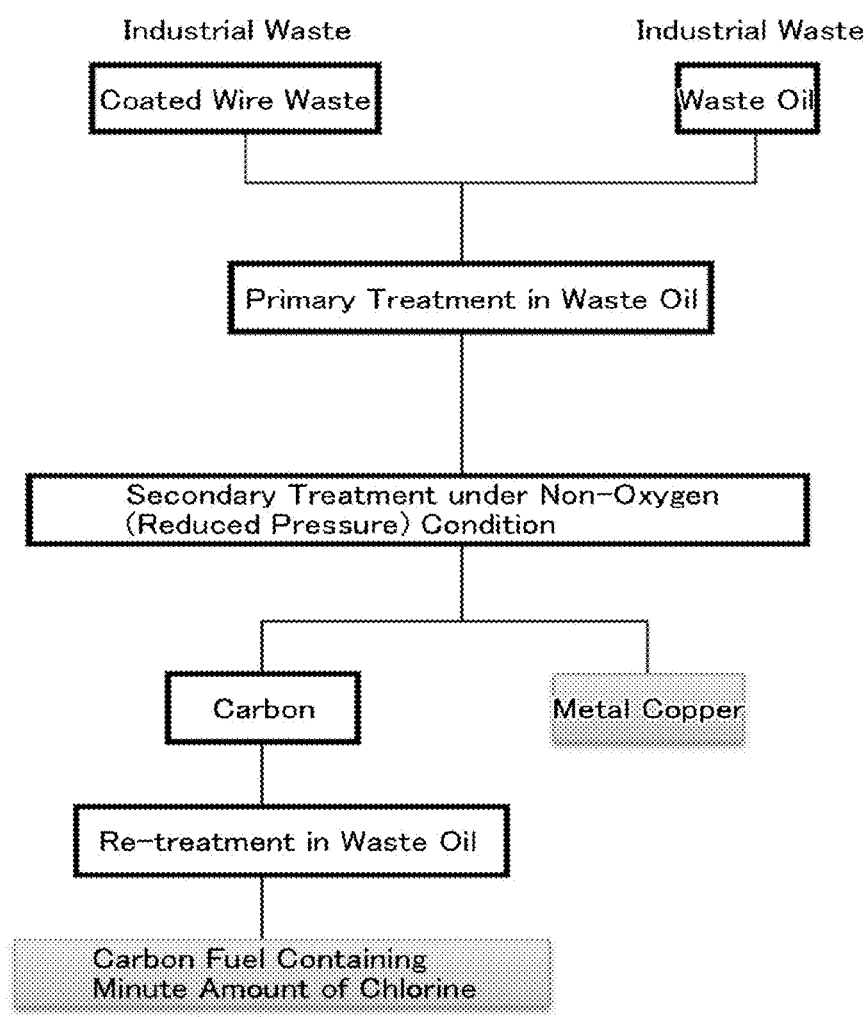
FIG. 3 is a flowchart illustrating an overall outline of the present invention in which tertiary treatment is added and a carbon is also utilized as fuel.
Figure 4:
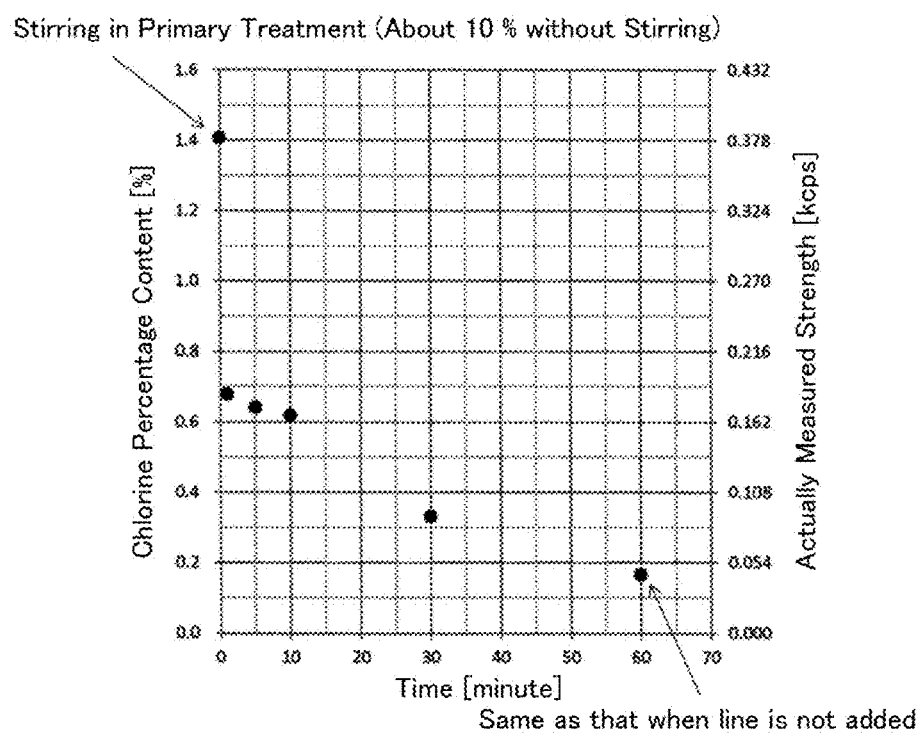
FIG. 4 is a graph to explain the chlorine content in the carbon after the tertiary treatment in FIG. 3.

As illustrated in FIG. 3, the carbon recovered in Example 1 was pulverized into size of not larger than 5 mm and was heat-treated again in the waste oil at 230° C. for 10 to 60 minutes. As illustrated in FIG. 4, the chlorine content in the carbon was reduced from a value slightly smaller than 1% by weight to 0.3% by weight regardless of whether 60% by weight of the alkaline substance (e.g., lime) was added or not. By additionally performing the above-mentioned treatment as a third stage, the chlorine content in the carbon was further reduced, and carbon fuel containing a minute amount of chlorine and being directly usable as fuel was obtained.

INDUSTRIAL APPLICABILITY

The present invention is concerned with the method for recovering metal copper from waste including a chlorine-containing synthetic resin and the metal copper, aiming to recover a useful substance by treating the waste including the chlorine-containing synthetic resin and the metal copper in a mixed state. By applying the present invention to recover, as resources, the metal copper from electric wires coated with the chlorine-containing synthetic resin, which wires are now discarded in a massive amount in Japan, for example, it is possible to effectively utilize the waste and to cut the cost required for the disposal. Furthermore, the present invention can be applied to not only the treatment of the coated-wire waste, but also waste including the chlorine-containing synthetic resin or other types of resins and the metal copper in a mixed state. Thus, the present invention provides a novel technique capable of preventing environmental pollution and adverse influences upon human health, which are attributable to the waste treatment. In addition, the present invention is advantageous when used as a method for effectively utilizing various types of waste oils. By further heat-treating coating materials in oil to further reduce the chlorine content therein, the coating materials can be recovered as carbon-based fuel.

The invention claimed is:

1. A method for recovering copper metal from coated copper-wire waste, the method comprising:
   heat-treating the waste in a form of coated copper wires comprising a coating material made of a chlorine-containing synthetic resin at 130-300° C. in oil, then
   heat-treating the waste at 130-300° C. in a nitrogen atmosphere or under a reduced pressure of not higher than 0.3 atmosphere without using oil, thereby carbonizing the coating material and reducing a chlorine content of the coating material, and
   separating the coating material and the copper wire from each other, thereby recovering the copper wire.

2. The method for recovering the metal copper from the coated copper-wire waste according to claim 1, wherein the heat-treating in the oil is performed in coexistence of an alkaline substance.

3. The method for recovering the metal copper from the coated copper-wire waste according to claim 1, the method, further comprising: after recovering the copper wire, heat-treating the coating material in oil to further reduce the chlorine content of the coating material, thereby recovering a heat-treated coating material as carbon-based fuel.

4. The method for recovering the metal copper from coated copper-wire waste according to claim 1, wherein the chlorine-containing synthetic resin comprises one or more selected from polyvinyl chloride, polyvinylidene chloride, a vinyl chloride copolymer, a chlorinated resin, or a mixture of the chlorine-containing synthetic resin.

* * * * *